United States Patent
Yamamoto

(10) Patent No.: US 6,230,509 B1
(45) Date of Patent: May 15, 2001

(54) ELECTRIC APPARATUS WITH INTEGRATED SEMICONDUCTOR COMPONENT

(75) Inventor: Osamu Yamamoto, Mie (JP)

(73) Assignee: Kabushiki Kaisha Toshiba (JP)

( * ) Notice: Subject to any disclaimer, the term of this patent is extended or adjusted under 35 U.S.C. 154(b) by 0 days.

(21) Appl. No.: 09/346,227

(22) Filed: Jul. 1, 1999

(30) Foreign Application Priority Data

Jul. 3, 1998 (JP) .................................................. 10-188841

(51) Int. Cl.⁷ ...................................................... F25D 23/12
(52) U.S. Cl. .............................. 62/259.2; 62/3.7; 165/137
(58) Field of Search ................................... 62/259.2, 3.7; 165/137

(56) References Cited

U.S. PATENT DOCUMENTS

| | | | |
|---|---|---|---|
| 4,660,124 | 4/1987 | Woy | 361/386 |
| 5,177,666 * | 1/1993 | Bland et al. | 361/382 |
| 5,471,850 * | 12/1995 | Cowans | 62/223 |
| 5,731,954 * | 3/1998 | Cheon | 361/699 |
| 5,992,155 * | 11/1999 | Kobayashi et al. | 62/3.7 |
| 6,055,822 * | 5/2000 | Pfister et al. | 62/259.2 |
| 6,088,223 * | 7/2000 | Diemunsch | 361/690 |
| 6,097,596 * | 8/2000 | Cipolla et al. | 361/687 |
| 6,109,039 * | 8/2000 | Hougham et al. | 62/3.7 |

FOREIGN PATENT DOCUMENTS

| | | |
|---|---|---|
| 1916874 | 6/1965 | (DE) . |
| 7207854 | 4/1976 | (DE) . |
| 2710432A1 | 9/1978 | (DE) . |
| 3713054A1 | 11/1987 | (DE) . |

* cited by examiner

Primary Examiner—William Doerrler
Assistant Examiner—Mark Shulman
(74) Attorney, Agent, or Firm—Gray Cary Ware & Freidenrich LLP

(57) ABSTRACT

An electric apparatus such as an inverter includes a cooler unit including a cooler, and a semiconductor component and an electrical component disposed on two opposite sides of the cooler respectively, and a housing for supporting the cooler unit. The cooler unit is pivotally supported on the housing so as to be taken into and out of the housing. The cooler unit is caused to pivot so as to be taken out of the housing when the semiconductor component is to be replaced.

9 Claims, 14 Drawing Sheets

ELECTRIC APPARATUS WITH INTEGRATED SEMICONDUCTOR COMPONENT

BACKGROUND OF THE INVENTION

1. Field of the Invention

This invention relates to an electric apparatus comprising semiconductor components such as transistors or thyristors as well as other electrical components.

2. Description of the Prior Art

FIGS. 20 and 21 show a conventional electric apparatus provided with an inverter circuit composed of semiconductor components. FIG. 20 is a front view of the apparatus, in which view a cover and circuit boards are eliminated so that an internal arrangement of the apparatus is easily understood. FIG. 21 is a bottom view of the apparatus, in which view a main circuit distribution terminal block for distribution of signals or electric power to customers is eliminated. Copper bus bars and wires for connection of main circuit electrical components are also eliminated in the views. The electric apparatus comprises a housing 40 made of a metal plate. The housing 40 accommodates therein a cooler 10 for cooling a semiconductor module 5 serving as a semiconductor component and a rectifier 6, a main circuit capacitor 7 for smoothing a main circuit voltage, a rush current preventing resistor 15 for restraining a rush current, a magnet contactor 8, a main circuit distribution terminal block 9 for electrically connecting internal main circuit electrical components to the wiring of a customer, a drive circuit board 13 for driving the semiconductor module 5 so that the module performs a switching operation, and a control circuit board 14 for controlling the apparatus.

The above-described electric apparatus has recently been miniaturized. For this purpose, a refrigerant has been used for improvement in the cooling performance of the cooler 10. Further, semiconductor components have been disposed on an inside or a backside of a heat absorbing section 10a as well as on an outside or a front of thereof so that a space for disposition of the semiconductor components is saved.

In the above-described disposition of the semiconductor components, when a maintenance work is carried out upon failure of one or more of the semiconductor components, the cooler 10 on which the failed component is mounted needs to be dismounted or detached from the apparatus in order that the semiconductor component disposed on the backside of the heat absorbing section 10a may be replaced or decomposed. Further, in a performance test carried out after decomposition or replacement of the semiconductor components, it is difficult for a workman to confirm the performance of the semiconductor component disposed on the backside of the cooler 10. Additionally, the cooler 10 on which the semiconductor components are mounted is sometimes moved from its regular position so that a probe of a measuring equipment etc. may be applied to the semiconductor component. In the performance test, specially prepared electrically connecting wires are used to connect the semiconductor component to main circuit components so that measurement is performed. In this case, however, the measurement sometimes shows that the characteristics of the apparatus are abnormal. The reason for this is that the electric apparatus is not constructed so as to properly cope with the performance test after the maintenance work.

SUMMARY OF THE INVENTION

Therefore, an object of the present invention is to provide an electric apparatus with an integrated semiconductor component which can provide easy replacement of the semiconductor component and easy execution of the performance test although the semiconductor component is disposed on the backside of the heat-absorbing section of the cooler.

The present invention provides an electric apparatus comprising a generally box-shaped housing having a front opening, a cover mounted on the housing so as to close and open the front opening of the housing, a cooler unit having an end supported in the housing so that the cooler unit pivots about a vertical axis, whereby the cooler unit is put into and taken out of the housing through the front opening of the housing, the cooler unit including a cooler further including a lower generally flat box-shaped heat-absorbing section, an upper heat-radiating section and a refrigerant enclosed in the cooler so as to be circulated by natural convection between the heat-absorbing and heat-radiating sections, the cooler having two opposite sides, the cooler unit further including at least two integrated semiconductor components disposed on the opposite sides of the cooler in heat transfer relation respectively, and a fan exhausting air around the heat-radiating section of the cooler outside the housing.

According to the above-described electric apparatus, the cooler unit pivots so as to be taken out of the housing when the semiconductor component is to be replaced. Accordingly, a replacing work can be rendered easier, and tests for electrical signals and characteristics of the apparatus can easily be performed.

In a preferred form, the apparatus further comprises, for example, a plate-shaped mounting member disposed in the housing so that the cooler unit and the electrical component are mounted thereon. In this case, the mounting member preferably has a measuring opening so that lengths of wires or cables connecting a probe to a measuring equipment can be reduced.

In another preferred form, the electric apparatus further comprises a cover attached to the cooler unit so as to cover the semiconductor component for extra safety for a workman during the tests for electrical signals and characteristics of the apparatus after the replacement of the semiconductor component.

For extra safety of the workman, the electric apparatus preferably further comprises an adjusting mechanism provided at the housing side for adjusting a turning angle of the cooler unit, and a holding mechanism for holding the cooler unit at the adjusted turning angle.

BRIEF DESCRIPTION OF THE DRAWINGS

Other objects, features and advantages of the present invention will become clear upon reviewing the following description of the preferred embodiments, made with reference to the accompanying drawings, in which.

DETAILED DESCRIPTION OF THE PREFERRED EMBODIMENTS

Figure 1:
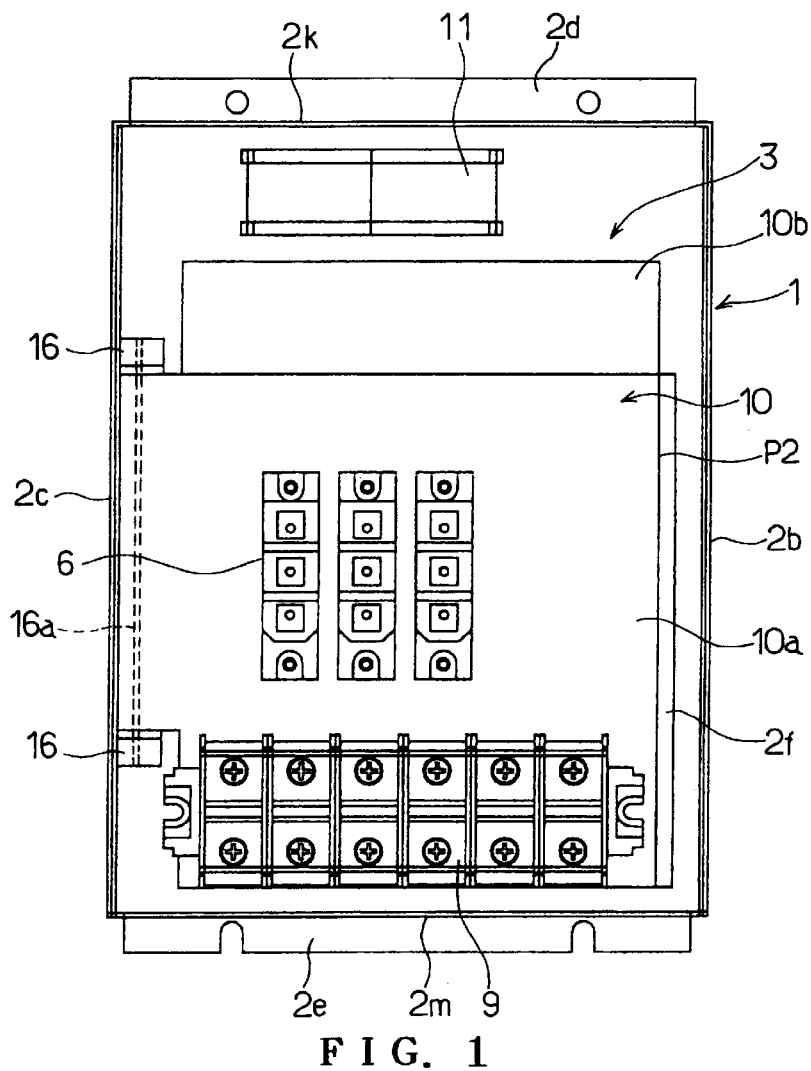
FIG. 1 is a front view of an inverter of a first embodiment in accordance with the present invention, with a front cover being removed and a circuit board and a capacitor being eliminated.
Figure 2:
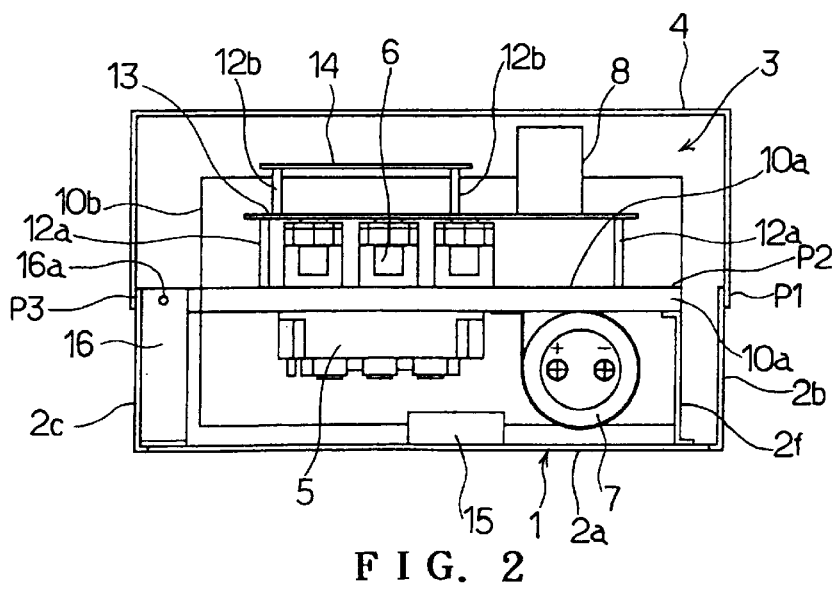
FIG. 2 is a bottom view of the inverter with main circuit distribution terminals being eliminated.
Figure 3:
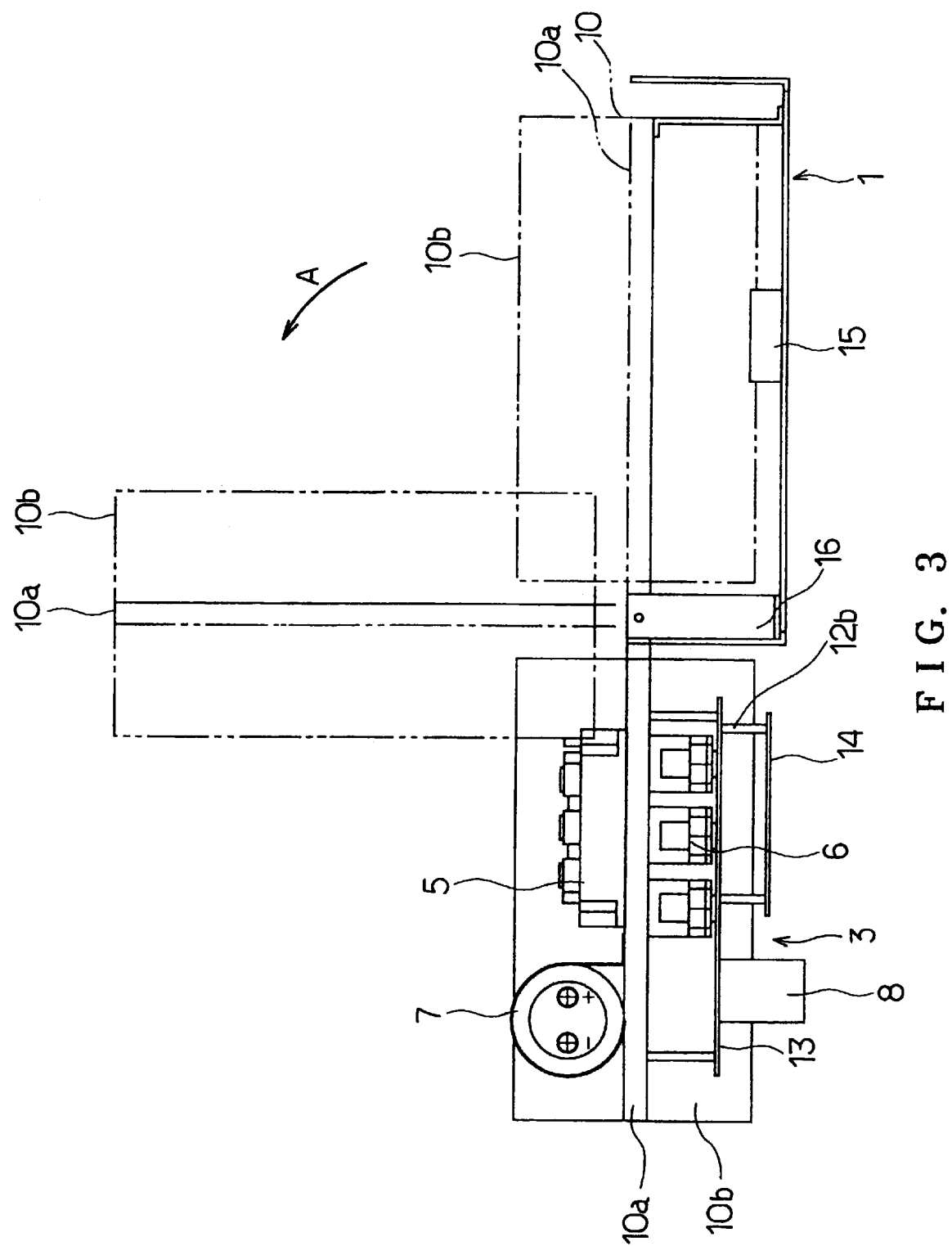
FIG. 3 is a bottom view of the inverter with a cooler unit being taken out of a housing.

A first embodiment of the present invention will be described with reference to FIGS. 1 to 5. The invention is applied to an inverter serving as an electric apparatus in the first embodiment. Referring to FIGS. 1 and 2, the inverter in accordance with the invention is shown. The inverter comprises a generally box-shaped housing 1 including a rear plate 2a, two side plates 2b and 2c, a top plate 2k and a bottom plate 2m. The housing 1 further has a front opening. A generally box-shaped cover 4 having a rear opening is screwed at a peripheral edge thereof shown by reference symbol P1 to the edges of the side plates 2b and 2c defining the front opening, so that the cover 4 is detachably attached to the housing 1. Two mounting flanges 2d and 2e extend from upper and lower ends of the rear plate 2a respectively. The mounting flanges 2d and 2e are fixed by screws to a wall of a room where the inverter is installed, so that the housing 1 is mounted on the wall.

A cooler unit 3 comprises a cooler 10 and components disposed on an outside or an outer face of a heat absorbing section 10a of the cooler 10. For example, the components include a semiconductor module 5 affecting characteristics of the apparatus, a rectifier 6 serving as an electrical component, a main circuit capacitor 7 for smoothing a main circuit current, and a main circuit distribution terminal block 9 electrically connecting main circuit electrical components in the housing 1 to the wiring of a customer.

The cooler 10 comprises the aforesaid heat-absorbing section 10a and a heat-radiating section 10b having a well known radiating structure. A refrigerant enclosed in the cooler 10 is circulated by natural convection between the heat-absorbing section 10a and the heat-radiating section 10b. The refrigerant is commercially available under the trademark of "Fluorinert" (type PF5060) from Sumitomo 3-M Corporation. In the heat-absorbing section 10a, the liquid-phase refrigerant absorbs an ambient heat or heat radiated from the semiconductor module 5 to thereby evaporate. A gas-phase refrigerant flows to the heat-radiating section 10b located over the heat-absorbing section 10a to radiate heat, thereby liquefying. The liquid-phase refrigerant then returns to the heat-absorbing section 10a. The semiconductor module 5 and the other components are cooled as the result of the above-described circulation of the refrigerant.

The cooler 10 is disposed near the front opening in the housing 1. One side end P2 of the cooler 10 is detachably connected by screws to a support plate 2f fixed in the housing 1. The other side end P3 of the cooler 10 is pivotally mounted on a shaft 16a further mounted on two supporting members 16 which are fixed to the left-hand side plate 2c so as to be vertically spaced from each other. A cooling fan 11 is provided near the heat-radiating section 10b of the cooler 10 in the housing 1.

Figure 4:
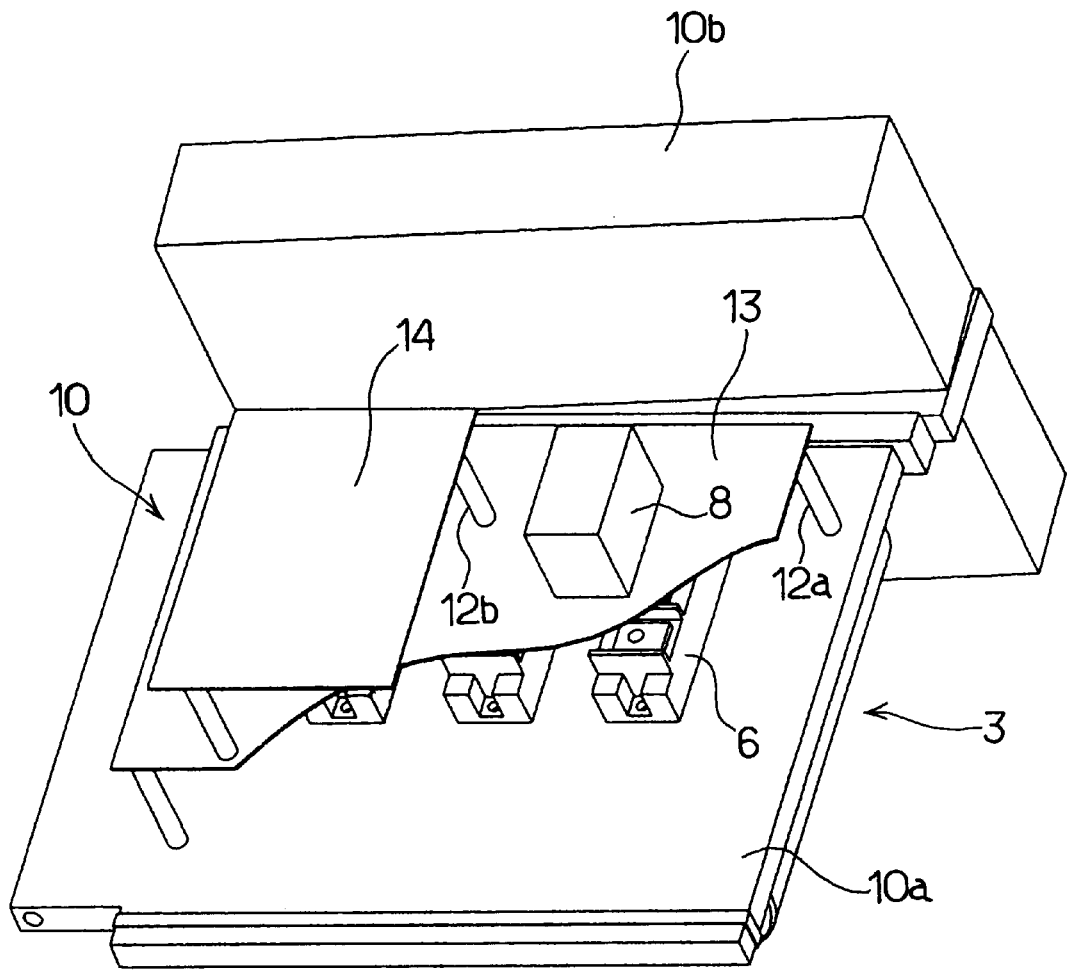
FIG. 4 is a schematic perspective view of a cooler unit, showing the front side thereof.
Figure 5:
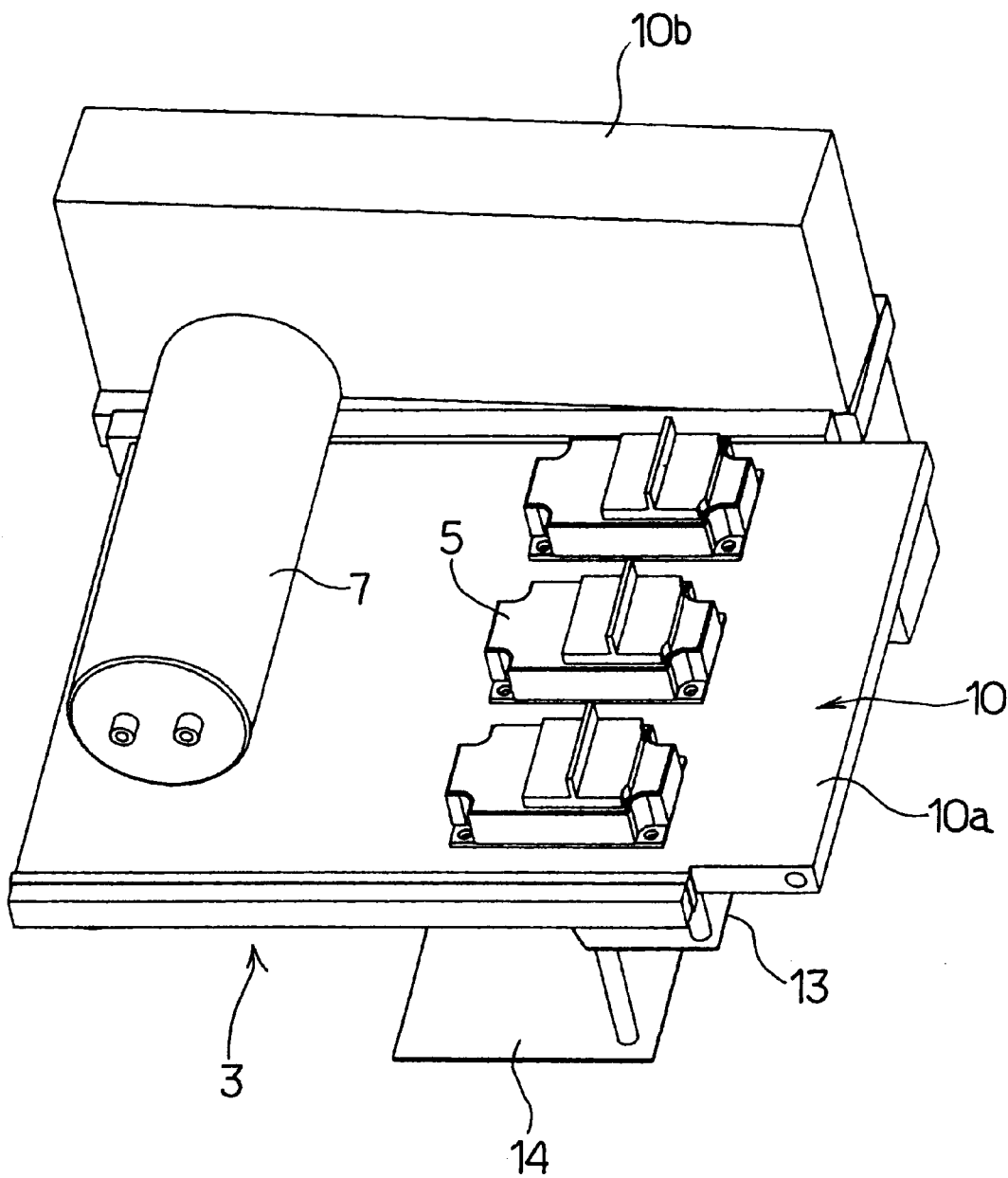
FIG. 5 is a schematic perspective view of the cooler unit, showing the rear side thereof.

The semiconductor module 5 and the capacitor 7 are mounted on a backside of the heat-absorbing section 10a facing the interior of the housing 1 as shown in FIGS. 4 and 5. The rectifier 6 and the terminal block 9 (not shown in FIG. 2) are mounted on an outside of the heat-absorbing section 10a opposed to the backside. A drive circuit board 13 is mounted on supports 12a further mounted on the outside of the heat-absorbing section 10a so as to be located in front of the terminal block 9, as shown in FIG. 2. A control circuit board 14 is further mounted via supports 12b on the outside of the heat-absorbing section 10a so as to be located in front of the drive circuit board 13. Although not shown in FIG. 1, a magnet contactor 8 for controlling current supplied to the apparatus is mounted on the drive circuit board 13 as shown in FIG. 2. A rush current restraining resistor 15 is provided on the rear plate 2a of the housing 1 to restrain a rush current flowing into the apparatus.

Upon failure or breakage of the semiconductor module 5 mounted on the backside of the heat-absorbing section 10a of the cooler 10, the cover 4 is detached and the screws at the side end P2 where the cooler 10 is fixed to the support 2f are loosened to be detached, so that the cooler 10 is allowed to pivot outside the housing 1 about the shaft 16a mounted on the supporting member 16. Consequently, since the semiconductor module 5 mounted on the backside of the heat-absorbing section 10a of the cooler 10 is located completely outside the housing 1, the failed or broken semiconductor module 5 can readily be replaced by a new one.

In the prior art, in order that various signals and the characteristics of the apparatus may be checked after the replacement of the semiconductor module, copper bus bars and wires cannot be connected between the electrical components unless the cooler is re-disposed in the housing. Thus, the signals and the characteristics of the apparatus are checked under a difficult condition in the prior art. When the cooler is not re-disposed in the housing, special long wires need to be used to electrically connect the components for the purpose of checking the signals and the characteristics of the apparatus. In this case, however, the checked characteristics of the apparatus sometimes differ from those in the state where the cooler is disposed in the housing.

In the above-described embodiment, however, all the components affecting the characteristics of the apparatus are disposed on both sides of the heat-absorbing section 10a of the cooler 10. Accordingly, even when the cooler 10 pivots out of the housing 1, the copper bus bars and wires interconnecting the components need not be removed and the lengths of the wires need not be increased when a performance test of the apparatus is carried out after the replacement of the semiconductor module 5. Consequently, the apparatus can be energized after the replacement of the semiconductor module and the signals and characteristics of the apparatus can readily be checked.

Figure 6:
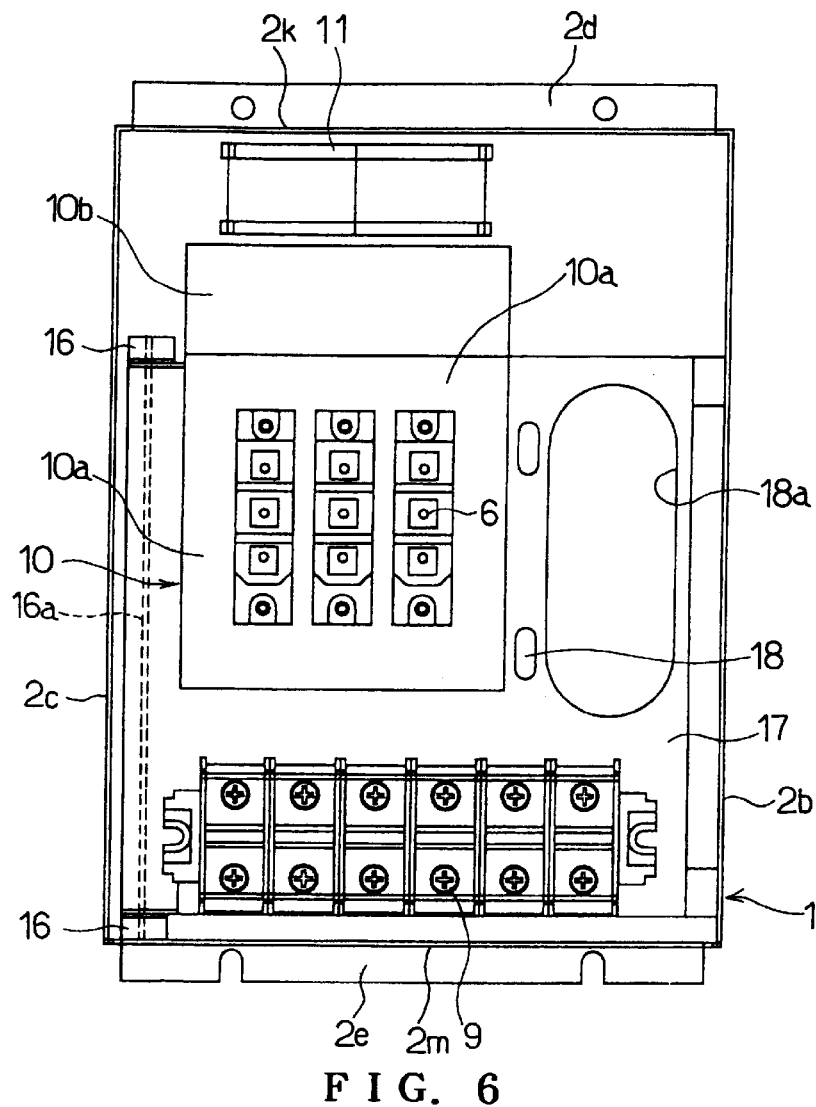
FIGS. 6 and 7 are views similar to FIGS. 1 and 2 respectively, showing a second embodiment in accordance with the invention.
Figure 7:
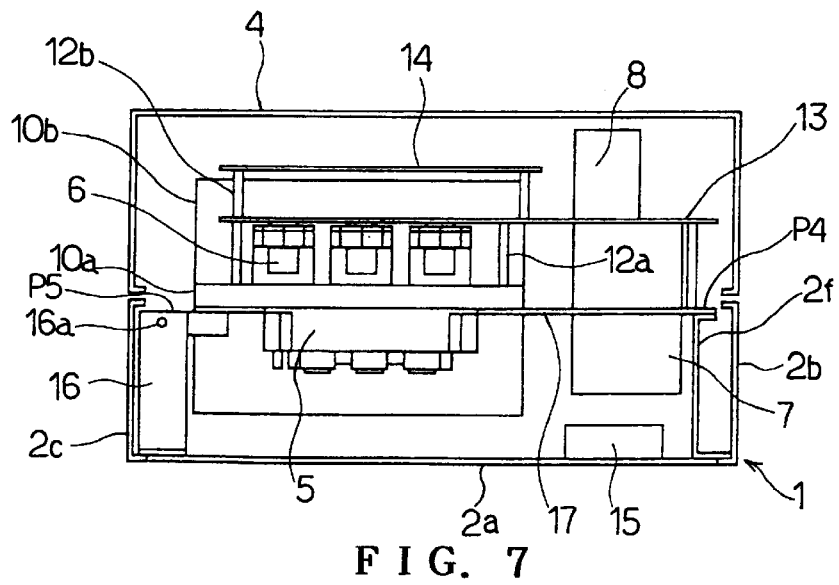

FIGS. 6 and 7 illustrate a second embodiment of the invention. One side end P4 of the plate-shaped mounting member 17 is connected by screws to the support plate 2f mounted on the housing 1. The other side end P5 of the mounting member 17 is mounted on the supporting member 16 so that the mounting member pivots about the shaft 16a. The cooler 10 and the terminal block 9 (see FIG. 6) are mounted on the mounting member 17. The semiconductor module 5 is mounted on the backside of the heat-absorbing section 10a, whereas the rectifier 6 is mounted on the outside thereof. The mounting member 17 is formed with a measuring hole 18 through which a probe of a measuring equipment can be inserted and a hole 18a through which the main circuit capacitor 7 mounted on the drive circuit board 13 extends.

The second embodiment can achieve the same effect as the first embodiment. Additionally, the probe of the measuring equipment etc. can be inserted through the measuring hole 18 a short distance to be set between the components mounted on the outside and the backside of the heat-absorbing section 10a respectively in the performance test after the replacement of the semiconductor module 5. An excessive increase in the length of a wire or cable connecting the probe to the measuring equipment causes noise or resonance, resulting in an erroneous measurement. In the second embodiment, however, provision of the measuring hole 18 can prevent such an erroneous measurement.

Figure 8:
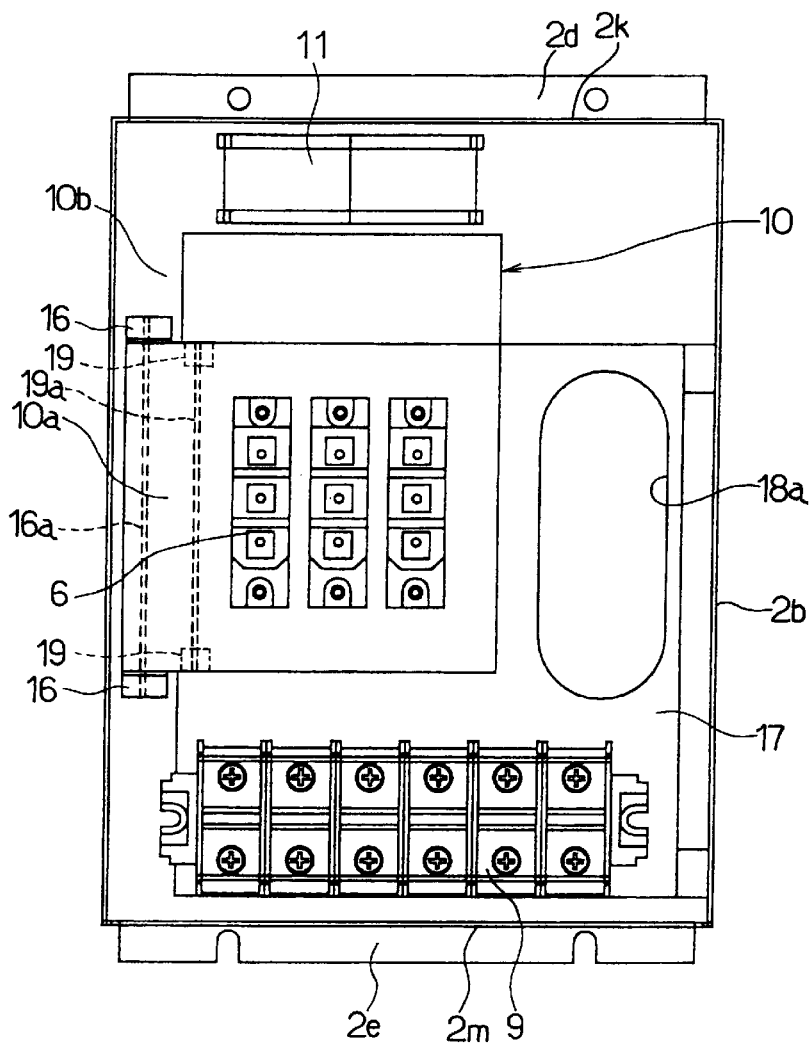
FIGS. 8 and 9 are views similar to FIGS. 1 and 2 respectively, showing a third embodiment in accordance with the invention.
Figure 9:
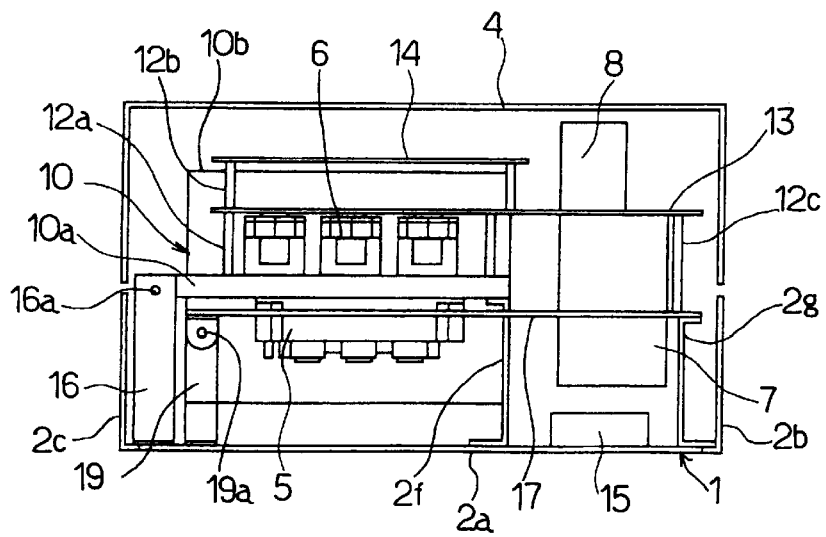

FIGS. 8 and 9 illustrate a third embodiment of the invention. The semiconductor module 5, the rectifier 6, the drive circuit board 13 and the control circuit board 14 are mounted on the cooler 10. The main circuit capacitor 7 and the magnet contactor 8 are mounted on the drive circuit board 13. The cooler 10 is mounted on the supporting members 16 and the support plate 2f so as to pivot about the shaft 16a in the same manner as in the first embodiment. The terminal block 9 (eliminated in FIG. 9) is mounted on the plate-shaped mounting member 17. One side end of the mounting member 17 is fixed by screws to a support plate 2g mounted on the housing 1. The other side end of the mounting member 17 is connected via a shaft 19a to another pair of supporting members 19 so as to pivot about the shaft. The right-hand end of the drive circuit board 13 is detachably connected via the support 12c to the mounting member 17. As a result, the cooler 10 and the mounting member 17 pivot about the respective shafts 16a and 19a independently of each other. A space through which the probe of the measuring equipment is inserted is defined between the cooler 10 and the mounting member 17.

The third embodiment can achieve the same effect as the second embodiment. In addition, the weight of the components can be distributed to the supporting members 16 and 19 supporting the cooler 10 and the mounting member 17 respectively. Consequently, the structure of the apparatus can be simplified with respect to the strength of the apparatus.

Figure 10:
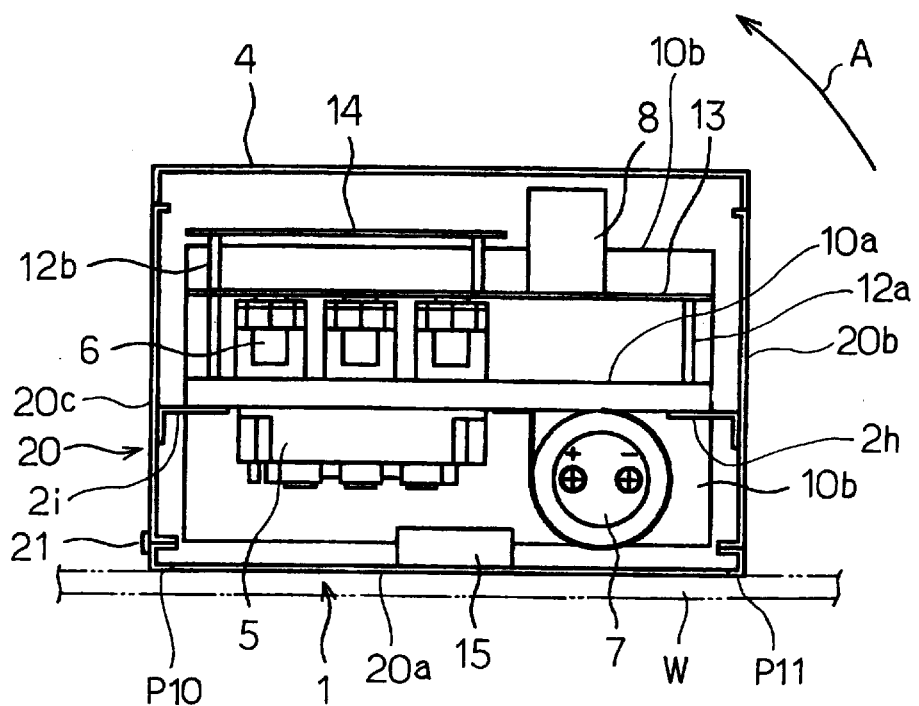
FIG. 10 is a view similar to FIG. 2, showing a fourth embodiment in accordance with the invention.

FIG. 10 illustrates a fourth embodiment of the invention. The semiconductor module 5, the rectifier 6 and the main circuit capacitor 7 are mounted on the cooler 10. The cooler 10 is fixed via supporting members 2h and 2i to right-hand and left-hand side plates 20b and 20c of a housing 20 having a front opening. One side end P10 of a rear plate 20a of the housing 20 is pivotally connected via a hinge 21 to the left-hand side plate 20c. The other side end P11 of the rear plate 20a is detachably connected to the right-hand side plate 20b by screws. Accordingly, when the rear plate 20a is fixed to a wall W of a room in which the apparatus is installed, the housing 20 pivots about the hinge 21 with the exception of the rear plate 20a in the direction of arrow A, in which direction the housing 1 departs from the wall W. Consequently, a portion of the cooler 10 on which the semiconductor module 5 is mounted is exposed outside or becomes open.

Figure 11:
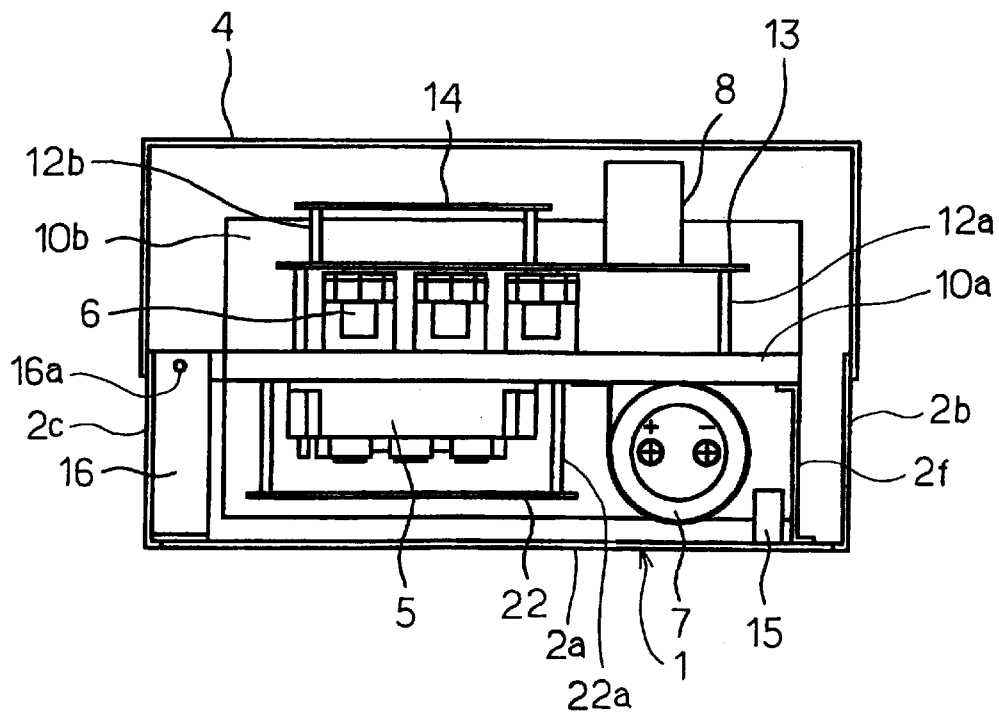
FIG. 11 is a view similar to FIG. 2, showing a fifth embodiment in accordance with the invention.

FIG. 11 illustrates a fifth embodiment of the invention. The fifth embodiment differs from the first embodiment in that a flat safety cover 22 is mounted on columns 22a further mounted on the backside of the heat-absorbing section 10a so as to cover the semiconductor module 5 mounted on the backside of the heat-absorbing section 10a.

The fifth embodiment can achieve the same effect as the first embodiment. Additionally, the safety cover can provide the working personnel with safety during the performance test or the check of the apparatus characteristics after replacement of the semiconductor module.

Figure 12:
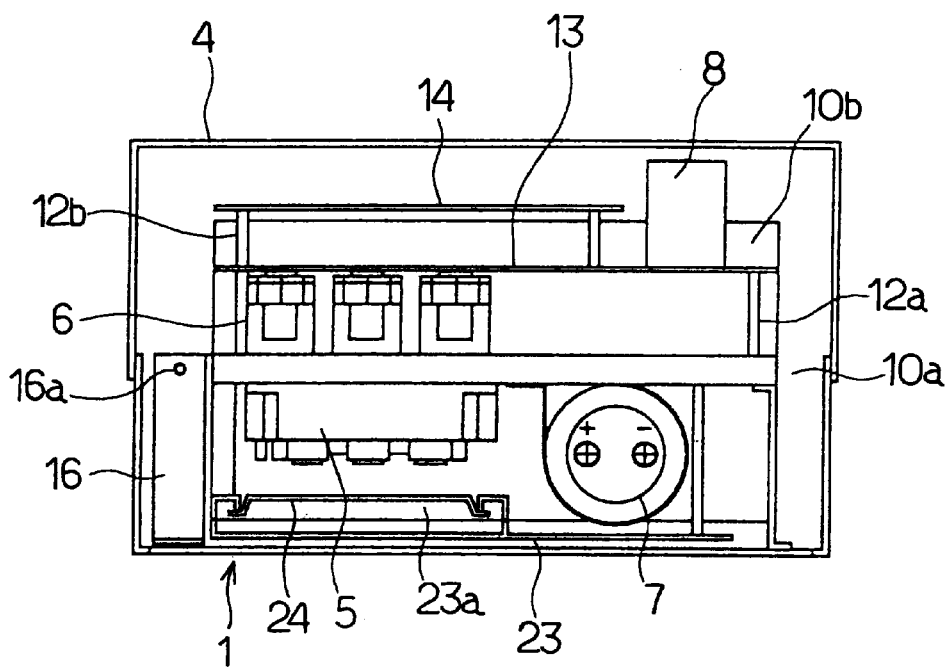
FIG. 12 is a view similar to FIG. 2, showing a sixth embodiment in accordance with the invention.

FIG. 12 illustrates a sixth embodiment of the invention. The sixth embodiment differs from the fifth embodiment in that a flat safety cover 23 is provided to cover not only the semiconductor module 5 but also electrically charged portions or heated portions such as the capacitor 7. The safety cover 23 has an opening 23a disposed to be suitable for the replacement of the semiconductor module 5 or the check of the apparatus characteristics. A small safety cover 24 is mounted to close the opening 23a and is detachable from the safety cover 22. The small safety cover 24 can be fixed to the safety cover 23 with the probe of the measuring equipment being inserted through the opening 23a for the performance test after the replacement of the semiconductor module 5.

Figure 13:
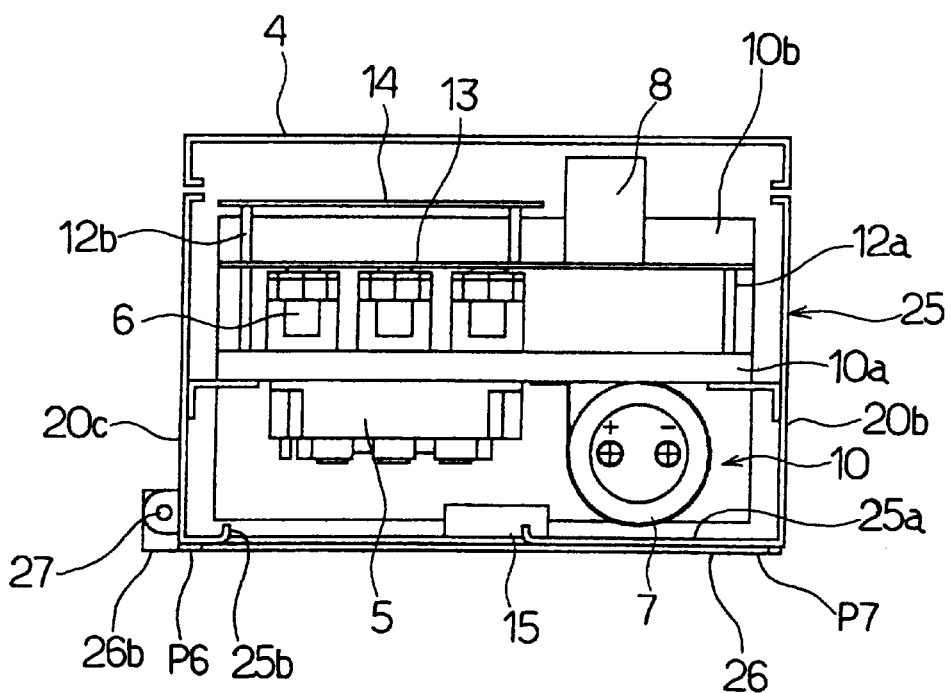
FIGS. 13 and 14 are view s similar to FIGS. 1 and 3 respectively, showing a seventh embodiment in accordance with the invention.
Figure 14:
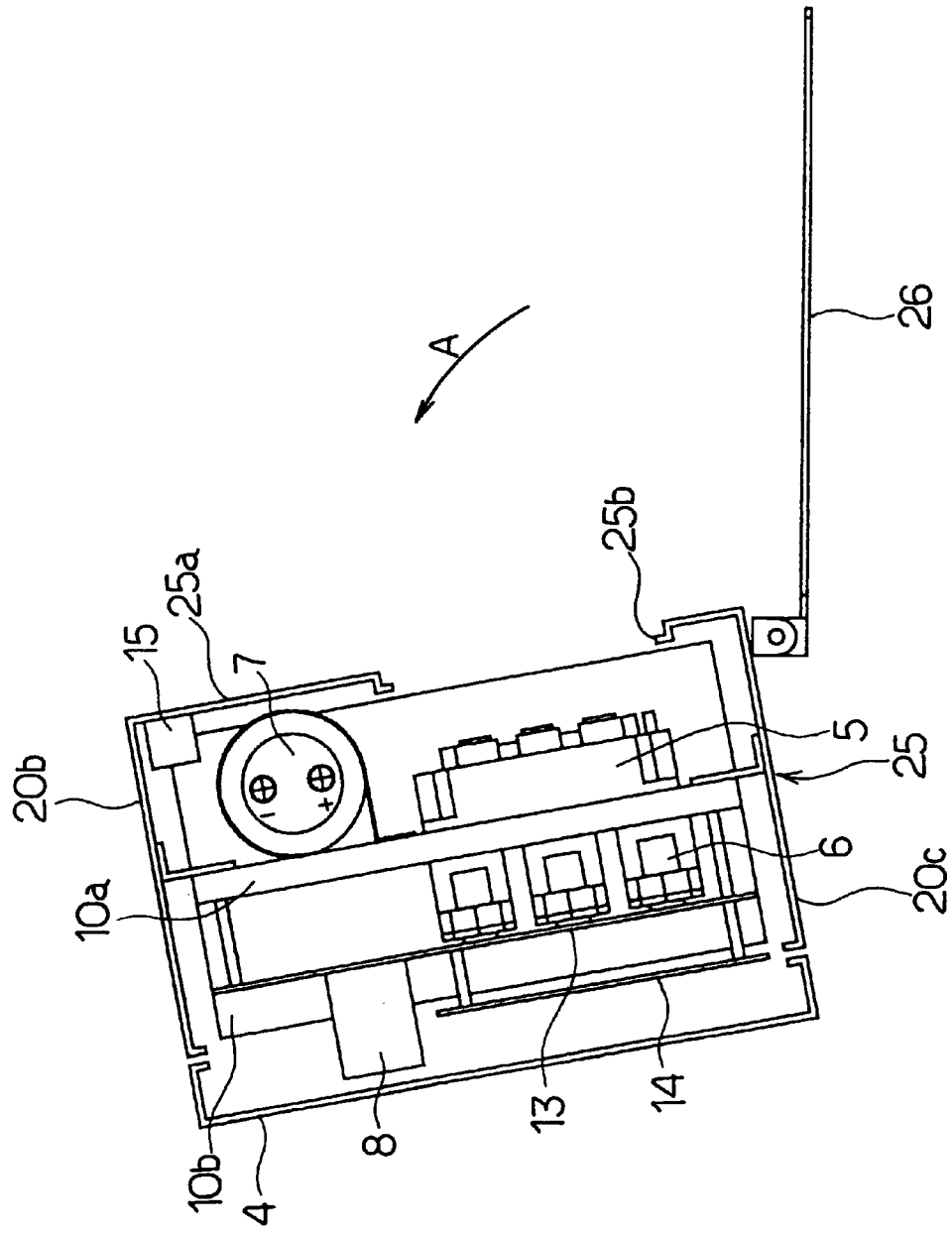

FIGS. 13 and 14 illustrate a seventh embodiment of the invention. The rear plate 25a of the housing 25 has an opening 25b formed for use in the replacement of the semiconductor device 5. A plate-shaped fixing member 26 for installation of the inverter is screwed at suitable portions P6 and P7 to the rear plate 25a. A shaft 27 connects a left-hand end 26b of the fixing member 26 to the left-hand side plate 20c of the housing 25 so that the fixing member 26 pivots about the shaft. When the inverter is installed, the fixing member 26 is fixed by screws to the room wall W (FIG. 10). In the inspection of the semiconductor module 5, the screws are loosened and unfastened so that the fixing member 26 is disconnected from the rear plate 25a of the housing 25. The housing 25 is then caused to pivot about the shaft 27 as shown in FIG. 14, so that the rear plate 25 departs from the fixing member 26. Consequently, the replacement of the semiconductor module 5 can be carried out through the opening 25b.

Figure 15:
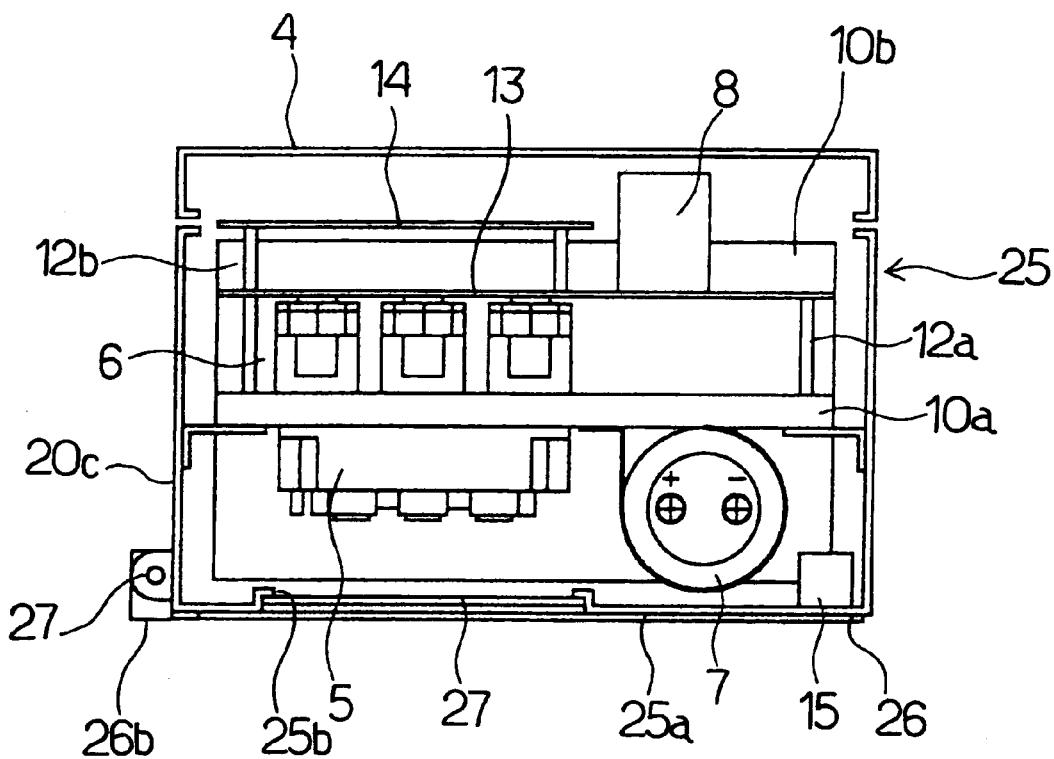
FIG. 15 is a view similar to FIG. 2, showing an eighth embodiment in accordance with the invention.

FIG. 15 illustrates an eighth embodiment of the invention. A flat plate-shaped safety cover 27 is detachably attached to the rear plate 25a so as to cover the opening 25b. The peripheral edge of the opening 25b is formed with notches (not shown) through which the measuring probe is inserted in the state where the cover 27 is attached to the rear plate 25a.

Figure 16:
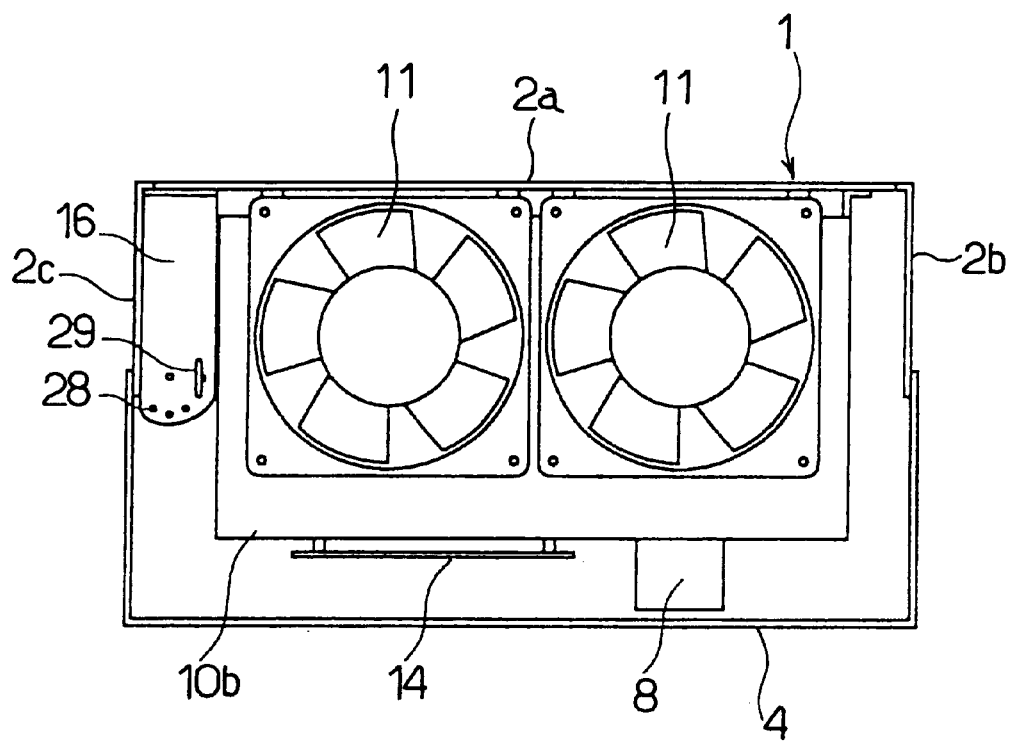
FIG. 16 is a plan view of the inverter of a ninth embodiment in accordance with the invention.
Figure 17:
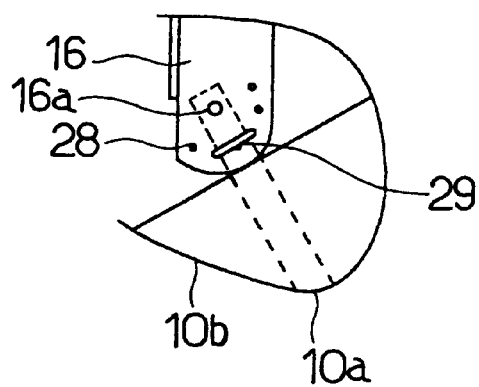
FIG. 17 is a partially enlarged plan view, showing a part of the inverter in a different state from that in FIG. 16.

FIG. 16 illustrates a ninth embodiment of the invention. A plurality of arcuately arranged holes 28 are formed in the top of the supporting member 16. A stopper 29 is also provided on the top of the supporting member 16. The other construction in the ninth embodiment is the same as that in the first embodiment. The stopper 29 includes a U-shaped piece which is selectively inserted into one of the two holes 28 spaced from each other two pitches. The U-shaped piece sandwiches the heat-absorbing section 10a of the cooler 10 so that the cooler 10 is held at a suitable turning angle about the shaft 16a.

In the replacement of the semiconductor module in the prior art, the workman needs to manipulate screws or electrical components with one hand while fixing the cooler with the other hand. In the above-described embodiment, however, the cooler 10 is fixed at a predetermined turning position in the replacement of the semiconductor module 5. This can avoid the working under the unstable condition as described above. Consequently, the working efficiency can be improved. Further, in a case where the cooler 10 is inadvertently moved during the performance test after the replacement of the semiconductor module 5, the probe of the measuring equipment sometimes falls off such that a short circuit occurs. However, since the cooler 10 is held by the stopper 29, the construction of the ninth embodiment can prevent the occurrence of the short circuit and provide the workman with safety.

Figure 18:
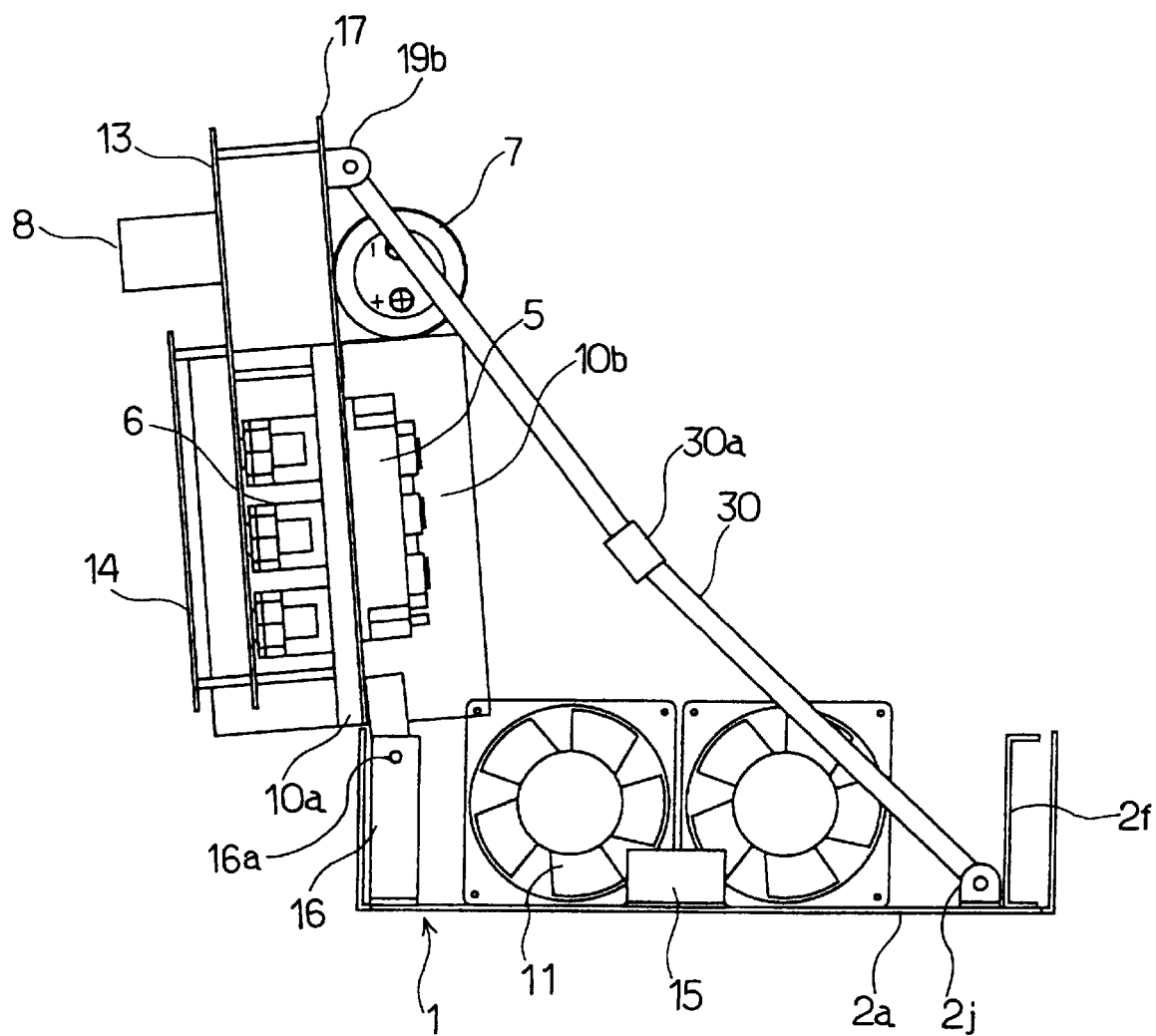
FIG. 18 is a bottom view of the inverter of a tenth embodiment in accordance with the invention, with the cooler unit being pivoted so as to be taken out of the housing.

FIG. 18 illustrates a tenth embodiment of the invention. The tenth embodiment is a modified form of the construction shown in FIG. 7. The mounting member 17 has a connecting strip 19b formed on a side end opposed to the side end connected to the shaft 16a. The housing 1 has a connecting strip 2j formed on the support plate 2f side therein. A bendable arm 30 or holding mechanism is connected between the connecting strips 19b and 2j. The bendable arm 30 has in the middle thereof a hinge 30a serving as an angle adjusting mechanism. The hinge 30a has an angle adjusting function and holds the apparatus body including the cooler 10 at a predetermined turning angle. Accordingly, the tenth embodiment can achieve the same effect as the ninth embodiment.

Figure 19:
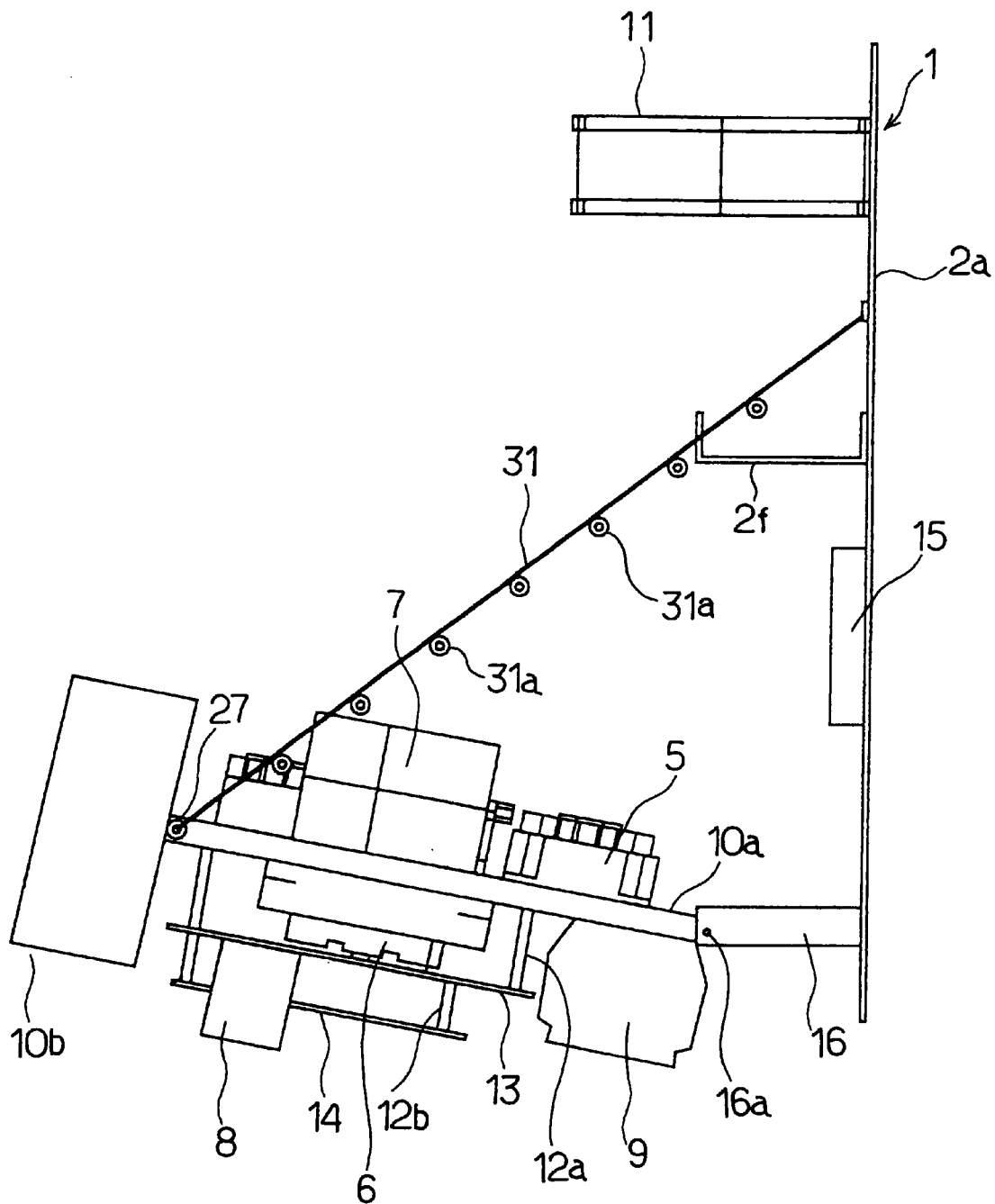
FIG. 19 is a bottom view of the inverter of an eleventh embodiment in accordance with the invention, with the cooler unit being pivoted so as to be taken out of the housing.
Figure 20:
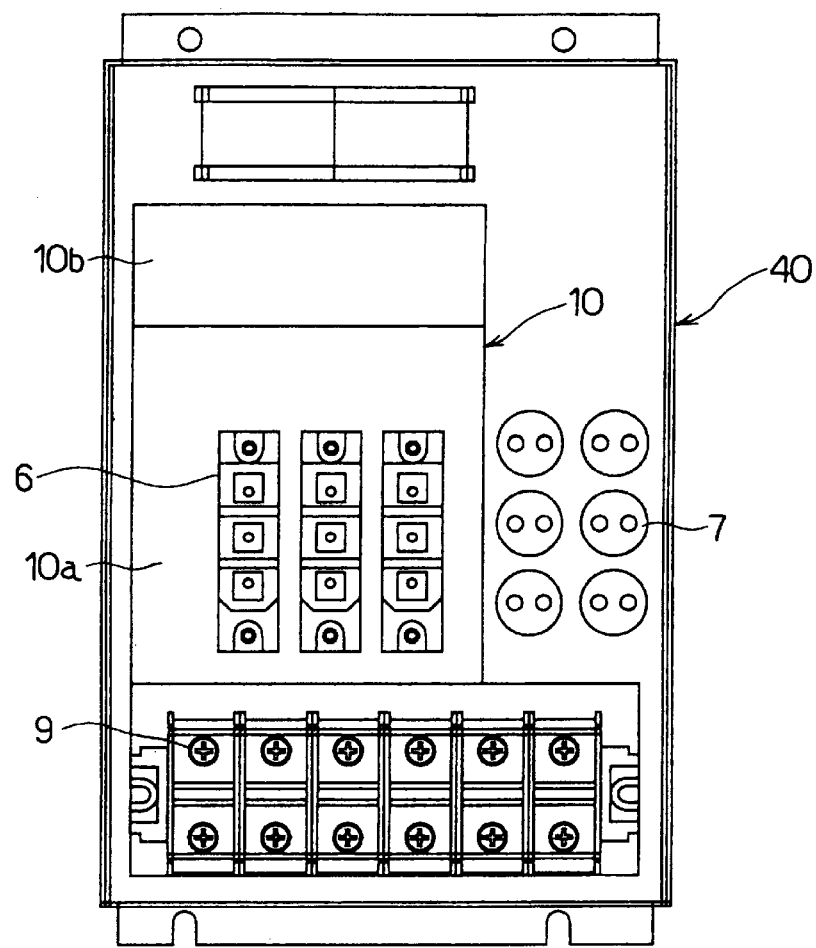
FIGS. 20 and 21 are views similar to FIGS. 1 and 2, showing a conventional inverter.
Figure 21:
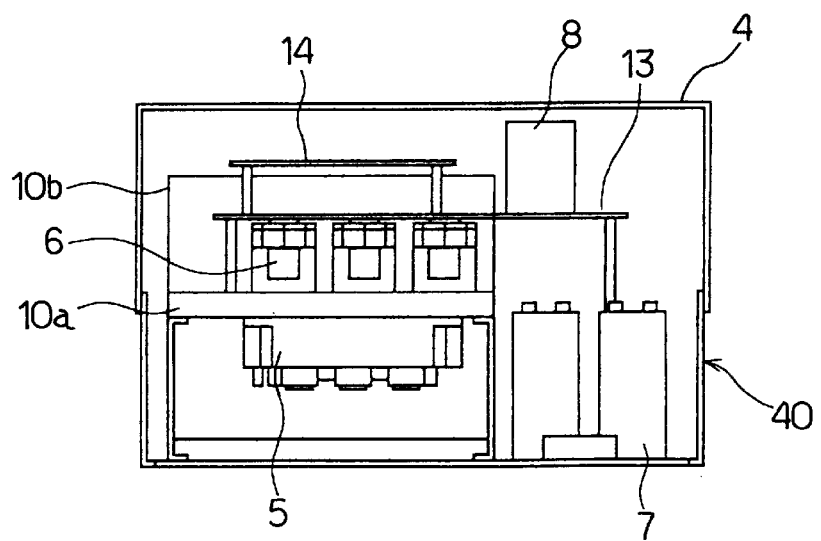

FIG. 19 illustrates an eleventh embodiment of the invention. The lower side of the heat-absorbing section 10a of the cooler 10 is connected via the shafts 16a to the supporting member 16 so that the cooler 10 pivots about the shafts 16a. Two hooks are provided on ends of both sides of the heat-absorbing section 10a near a joint thereof with the heat-radiating section 10b. A wire 31 serving as a holding mechanism has one end connected to the rear plate 2a. The wire 31 includes protrusions 31a arranged thereon at predetermined intervals. A suitable one of the protrusions 31a is caught on the hooks 27 such that the turning angle of the cooler 10 is adjusted. Consequently, the eleventh embodiment can achieve the same effect as the tenth embodiment. Further, the safety can be increased since the cooler 10 having a relatively larger weight is supported by the wire 31 as well as by the shafts 16a.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

I claim:

1. An electric apparatus comprising:
a generally box-shaped housing having a front opening;
a cover mounted on the housing so as to close and open the front opening of the housing;
a cooler unit having an end supported in the housing so that the cooler unit pivots about a vertical axis, whereby the cooler unit is put into and taken out of the housing through the front opening of the housing, the cooler unit including a cooler having a lower generally flat box-shaped heat-absorbing section, an upper heat-radiating section and a refrigerant enclosed in the cooler so as to be circulated by natural convection between the heat-absorbing and heat-radiating sections, the cooler having two opposite sides, the cooler unit further including at least two integrated semiconductor components disposed on the opposite sides of the cooler in heat transfer relation therewith; and
a fan exhausting air around the heat-radiating section of the cooler to outside the housing.

2. An electric apparatus comprising:
a generally box-shaped housing having a front opening;
a cover mounted on the housing so as to close and open the front opening of the housing;
a mounting member having an end supported in the housing so that the mounting member pivots about a vertical axis;
a cooler unit mounted on the mounting member so that the cooler unit is put into and taken out of the housing through the front opening of the housing by pivoting the mounting member, the cooler unit including a cooler having a lower generally flat box-shaped heat-absorbing section, an upper heat-radiating section and a refrigerant enclosed in the cooler so as to be circulated by natural convection between the heat-absorbing and heat-radiating sections, the cooler having two opposite sides, the cooler unit further including at least two integrated semiconductor components disposed on the opposite sides of the cooler in heat transfer relation therewith; and
a fan exhausting air around the heat-radiating section of the cooler to outside the housing.

3. An electric apparatus according to claim 1, further comprising a cover attached to the cooler unit so as to cover the semiconductor components.

4. An electric apparatus according to claim 1, further comprising a supporting member provided at a side of the housing for supporting the cooler unit so that the cooler unit pivots, the supporting member including a mechanism for adjusting a turning angle of the cooler unit and a mechanism for holding the cooler unit at the adjusted turning angle.

5. An electric apparatus according to claim 1, further comprising a mechanism for maintaining a turning angle of the cooler unit at a predetermined value.

6. An electric apparatus according to claim 1, further comprising a supporting member provided at a side of the housing for supporting the cooler unit so that the cooler unit pivots, an adjusting mechanism provided at the housing side for adjusting a turning angle of the cooler unit, and a holding mechanism for holding the cooler unit at the adjusted turning angle, wherein the supporting member and the holding mechanism receive a weight of the cooler unit assuming a predetermined turning position.

7. An electric apparatus according to claim 2, wherein the mounting member has a measuring opening through which an electrical measuring instrument may be inserted.

8. An electric apparatus comprising:
generally box-shaped housing having a front opening;
a cover mounted on the housing so as to close and open the front opening of the housing;
a cooler unit having an end supported in the housing so that the cooler unit pivots about a vertical axis, whereby the cooler unit is put into and taken out of the housing through the front opening of the housing, the cooler unit including a cooler having a lower generally flat box-shaped heat-absorbing section, an upper heat-radiating section and a refrigerant enclosed in the cooler so as to be circulated by natural convection between the heat-absorbing and heat-radiating sections, the cooler having two opposite sides, the cooler unit further including at least two integrated semiconductor components disposed on the opposite sides of the cooler in heat transfer relation therewith;

a mounting member having an end supported in the housing so that the mounting member is put into and taken out of the housing through the front opening of the housing by pivoting about an vertical axis;

an electric component mounted on the mounting member; and a fan exhausting air around the heat-radiating section of the cooler to outside the housing.

9. An electric apparatus according to claim 8, wherein the mounting member has a measuring opening through which an electrical measuring instrument may be inserted.

* * * * *